United States Patent
Powell

(10) Patent No.: US 11,108,392 B2
(45) Date of Patent: Aug. 31, 2021

(54) PROXIMITY SENSORS AND METHODS OF DETECTING MOVEMENT OF AN OBJECT VIA SAME

(71) Applicant: Jaguar Land Rover Limited, Coventry (GB)

(72) Inventor: Richard Powell, Coventry (GB)

(73) Assignee: JAGUAR LAND ROVER LIMITED, Coventry (GB)

( * ) Notice: Subject to any disclaimer, the term of this patent is extended or adjusted under 35 U.S.C. 154(b) by 0 days.

(21) Appl. No.: 15/748,547

(22) PCT Filed: Sep. 13, 2016

(86) PCT No.: PCT/EP2016/071539
§ 371 (c)(1),
(2) Date: Jan. 29, 2018

(87) PCT Pub. No.: WO2017/046078
PCT Pub. Date: Mar. 23, 2017

(65) Prior Publication Data
US 2018/0219550 A1    Aug. 2, 2018

(30) Foreign Application Priority Data

Sep. 14, 2015 (GB) ..................... 1516195

(51) Int. Cl.
*H03K 17/955* (2006.01)
(52) U.S. Cl.
CPC ............... *H03K 17/955* (2013.01); *H03K 2217/960765* (2013.01); *H03K 2217/960775* (2013.01)
(58) Field of Classification Search
CPC ...... H03K 17/955; H03K 17/962–9622; G06F 3/044
See application file for complete search history.

(56) References Cited

U.S. PATENT DOCUMENTS

| 3,896,425 A | * | 7/1975 | Erichsen | G08B 13/26 340/563 |
| 5,256,590 A | * | 10/1993 | Inoue | H01L 23/552 257/E23.114 |

(Continued)

FOREIGN PATENT DOCUMENTS

| CN | 101821133 A | 9/2010 |
| CN | 102725720 A | 10/2012 |

(Continued)

OTHER PUBLICATIONS

Patents Act 1977: Combined Search and Examination Report under Sections 17 and 18(3), UKIPO Application No. GB1516195.3, dated Mar. 11, 2016, 9 pp.

(Continued)

*Primary Examiner* — Huy Q Phan
*Assistant Examiner* — David B Frederiksen
(74) *Attorney, Agent, or Firm* — McCoy Russell LLP

(57) ABSTRACT

Some embodiments of the present invention provide a proximity sensor (300) comprising: at least a first sensor portion, a second sensor portion and a third sensor portion, the second sensor portion being provided between the first and third sensor portions, the first and third sensor portions each comprising at least a portion of a or a respective substrate (310) having first and second opposite major faces, the first and third sensor portions each bearing on a major face of the or the respective substrate at least a portion of a substantially planar transmit electrode (320), and a substantially planar receive electrode (330A, 330B) arranged to receive a signal transmitted by the respective at least a portion of a transmit electrode, the second sensor portion comprising a first region (315), the sensor comprising a ground shield portion (340) comprising one or more substantially planar, elongate electrodes, the ground shield portion having at least one elongate portion laterally dis- (Continued)

posed between the receive electrode of the first sensor portion and the first region of the second sensor portion, and at least one elongate portion disposed between the first region of the second sensor portion and the receive electrode of the third sensor portion, the sensor (300) being configured to allow a radio frequency (RF) signal to be applied to the transmit electrode (320) to cause a corresponding RF signal to be induced in each receive electrode (330A-D), the relative strength of the RF signals induced in the receive electrode (330A-D) of the respective portions being responsive to the relative distance of a conducting object therefrom.

17 Claims, 4 Drawing Sheets

(56) References Cited

U.S. PATENT DOCUMENTS

| | | | | |
|---|---|---|---|---|
| 5,277,625 | A * | 1/1994 | Iannella | H01R 13/7195 |
| | | | | 439/620.11 |
| 5,933,288 | A | 8/1999 | Plesko | |
| 6,828,806 | B1 * | 12/2004 | Hirota | G01D 5/2405 |
| | | | | 324/688 |
| 2002/0113663 | A1 * | 8/2002 | Anthony | H03H 1/0007 |
| | | | | 333/12 |
| 2002/0154039 | A1 | 10/2002 | Lambert et al. | |
| 2006/0012944 | A1 * | 1/2006 | Mamigonians | G06F 3/044 |
| | | | | 361/303 |
| 2007/0057359 | A1 * | 3/2007 | Anthony | H01R 13/719 |
| | | | | 257/691 |
| 2007/0216657 | A1 * | 9/2007 | Konicek | G06F 3/0412 |
| | | | | 345/173 |
| 2008/0202912 | A1 * | 8/2008 | Boddie | H03K 17/962 |
| | | | | 200/600 |
| 2008/0257706 | A1 * | 10/2008 | Haag | B29C 45/14655 |
| | | | | 200/600 |
| 2009/0108985 | A1 * | 4/2009 | Haag | H05K 9/0092 |
| | | | | 338/248 |
| 2010/0117977 | A1 * | 5/2010 | Yoshino | G06F 3/044 |
| | | | | 345/173 |
| 2011/0254570 | A1 * | 10/2011 | Sage | H03K 17/9622 |
| | | | | 324/679 |
| 2012/0007554 | A1 | 1/2012 | Kanamori et al. | |
| 2012/0081328 | A1 | 4/2012 | Kandziora et al. | |
| 2012/0129580 | A1 | 5/2012 | Tam | |
| 2012/0161795 | A1 * | 6/2012 | Pfau | H03K 17/962 |
| | | | | 324/679 |
| 2012/0200523 | A1 * | 8/2012 | Westhues | G06F 3/0237 |
| | | | | 345/174 |
| 2013/0015868 | A1 | 1/2013 | Peng | |
| 2013/0015898 | A1 | 1/2013 | Demone | |
| 2013/0106774 | A1 * | 5/2013 | Radivojevic | G06F 3/044 |
| | | | | 345/174 |
| 2014/0084145 | A1 * | 3/2014 | Guan | G01S 7/4813 |
| | | | | 250/216 |
| 2014/0293169 | A1 * | 10/2014 | Uken | B60R 1/12 |
| | | | | 349/12 |
| 2015/0029067 | A1 * | 1/2015 | Pang | H01Q 13/10 |
| | | | | 343/770 |
| 2016/0092000 | A1 * | 3/2016 | Morein | G06F 3/044 |
| | | | | 345/174 |

FOREIGN PATENT DOCUMENTS

| | | | | |
|---|---|---|---|---|
| CN | 102843122 A | | 12/2012 | |
| CN | 103918182 A | | 7/2014 | |
| GB | 2 435 998 A | | 9/2007 | |
| GB | 2435998 A | * | 9/2007 | ........... D06F 39/005 |

OTHER PUBLICATIONS

International Search Report and Written Opinion of the International Searching Authority, International Application No. PCT/EP2016/071539, dated Dec. 9, 2016, 14 pp.

\* cited by examiner

PROXIMITY SENSORS AND METHODS OF DETECTING MOVEMENT OF AN OBJECT VIA SAME

RELATED APPLICATIONS

This application is a 35 U.S.C. § 371 national stage application of PCT Application No. PCT/EP2016/071539, filed on Sep. 13, 2016, which claims priority from Great Britain Patent Application No. 1516195.3 filed on Sep. 14, 2015, the contents of which are incorporated herein by reference in their entireties. The above-referenced PCT International Application was published in the English language as International Publication No. WO 2017/046078 A1 on Mar. 23, 2017.

TECHNICAL FIELD

The present disclosure relates to a sensor and a method of sensing. Aspects of the invention relate to a sensor, a motor vehicle and a method.

BACKGROUND

It is known to provide a proximity sensor for detecting the proximity of a hand of a user and generating an electrical signal in response. The electrical signal may be used to enable control of an electrical apparatus.

Proximity sensors typically present a relatively large surface area to a user, and must be located sufficiently close to a user to enable the user to trigger the sensor without undue movement by the user, particularly where the sensor is required to be operated by a driver.

It is desirable to incorporate an increasing number of electrical and electronic components and devices in the cockpit of a motor vehicle including sensors, switchpacks and display screens without compromising significantly the performance of the components and devices.

It is an aim of the present invention to address disadvantages associated with the prior art.

SUMMARY OF THE INVENTION

Aspects and embodiments of the present invention provide a controller, a vehicle and a method. Embodiments of the invention may be understood with reference to the appended claims.

In an aspect of the invention there is provided a proximity sensor comprising: a substrate; a transmit electrode disposed on a first major face of the substrate; and first and second receive electrodes disposed in spaced apart relationship on an opposite major face of the substrate; the sensor being configured to allow a radio frequency (RF) signal to be applied to the transmit electrode to cause a corresponding RF signal to be induced in each receive electrode wherein the relative strength of the RF signals induced in the receive electrodes is dependent on the relative distance of a conducting object therefrom; the sensor further comprising a ground shield portion disposed on said opposite major face of the substrate between the first and second receive electrodes, the ground shield portion comprising at least first and second elongate electrode portions disposed in spaced apart relationship and defining, at least in part, a first region therebetween.

Optionally, the ground shield portion is arranged substantially to encompass the first region.

Optionally, the first region comprises an aperture therethrough.

Optionally, the receive electrodes are disposed on respective substrate and the first region comprises a substrate, and wherein the respective substrates are substantially coplanar.

Optionally, the first and second receive electrodes and the first region each comprise a respective portion of a common substrate.

Optionally, a first axis of the sensor passes through the receive electrodes and a second axis of the sensor, orthogonal to the first, passes through each of a further pair of receive electrodes arranged on opposite sides of the first region, wherein the relative strength of the RF signals induced in the further pair of receive electrodes is responsive to the relative distance of the conducting object therefrom.

Optionally, a conducting object is disposed through the aperture of the first region. At least one electronic device may be disposed through the aperture. At least a portion of a wireless optical communications transmitter and/or receiver may be disposed through the aperture of the first region.

Optionally, the sensor may be provided in combination with a sensor controller, the sensor controller being configured to apply the radio frequency (RF) signal to the transmit electrode to cause a corresponding RF signal to be induced in each receive electrode, the controller being configured to provide an output signal indicative of the relative strength of the RF signals induced in the receive electrodes.

Optionally, the sensor may be configured to provide an output signal indicative of the relative strength of the RF signals induced in the further pair of receive electrodes.

In one aspect of the invention for which protection is sought there is provided a proximity sensor comprising at least a first sensor portion, a second sensor portion and a third sensor portion. The second sensor portion may be provided between the first and third sensor portions. The first and third sensor portions may each comprise at least a portion of a respective substrate having first and second opposite major faces. The first and third sensor portions may each bear on a major face of the or the respective substrate at least a portion of a substantially planar transmit electrode, and a substantially planar receive electrode arranged to receive a signal transmitted by the respective portion of the transmit electrode. The second sensor portion may comprise a first region. The sensor may comprise a ground shield portion comprising one or more substantially planar, elongate electrodes. The ground shield portion may have at least one elongate portion laterally disposed between the receive electrode of the first sensor portion and the first region of the second sensor portion. The ground shield portion may have at least one elongate portion disposed between the first region of the second sensor portion and the receive electrode of the third sensor portion. The sensor may be configured to allow a radio frequency (RF) signal to be applied to the transmit electrode to cause a corresponding RF signal to be induced in each receive electrode, the relative strength of the RF signals induced in the receive electrode of the respective portions being in dependence on the relative distance of a conducting object therefrom.

Embodiments of the present invention have the surprising technical advantage that an amount of attenuation of an electric field generated by the transmit electrode when a conducting object is disposed on or through the first region of the second sensor portion may be reduced. This is believed to be at least in part because the ground shield portion reduces the amount by which an electric field, generated by each at least a portion of a transmit electrode of the first and third portions, is attenuated by the presence of a conducting object disposed on or through the second sensor portion.

Optionally, the ground shield portion is arranged substantially to encompass the first region of the second sensor portion.

Optionally, the first region of the second sensor portion comprises an aperture therethrough.

Optionally, the ground shield portion is arranged substantially to encompass the first region of the second sensor portion.

Optionally, the second sensor portion comprises a substrate and each of the first and third portions comprises a respective substrate, the substrate of the second portion being substantially coplanar with the substrates of the first and second portions.

Optionally, the first, second and third sensor portions each comprise a respective portion of a common substrate.

Optionally, at least a portion of a transmit electrode of the first and third portions comprises a single transmit electrode formed over one major face of the common substrate.

Optionally, the at least one substantially planar receive electrode of each of the first and third sensor portions is provided over an opposite major face to that over which the single transmit electrode is provided.

Optionally, a first axis of the sensor passes through the receive electrodes of the first and second sensor portions and a second axis of the sensor, orthogonal to the first, passes through each of a further pair of receive electrodes arranged one on each of opposite sides of the first region of the second portion, wherein the relative strength of the RF signals induced in the further pair of receive electrodes is responsive to the relative distance of the conducting object therefrom.

It is to be understood that this feature has the advantage that the sensor may be made sensitive to movement of the conducting object in two dimensions in a plane parallel to the sensor.

In some embodiments, the sensor may be arranged wherein a notional line joining the centre of area of the planar receive electrodes of the first and second portions is substantially orthogonal to a notional line joining the centre of area of the further pair of receive electrodes.

Optionally, a conducting object is disposed through the aperture of the first region of the second sensor portion.

Optionally, at least one electronic device is disposed through the aperture of the first region of the second sensor portion.

Optionally, at least a portion of a wireless optical communications transmitter and/or receiver is disposed through the aperture of the first region of the second sensor portion.

In an aspect of the invention for which protection is sought there is provided a sensor according to another aspect of the invention in combination with a sensor controller. The sensor controller may be configured to apply the radio frequency (RF) signal to the transmit electrode to cause a corresponding RF signal to be induced in the receive electrode of each of the first and third sensor portions. The controller may be configured to provide an output signal indicative of the relative strength of the RF signals induced in the receive electrode of the respective portions.

The sensor may be configured to provide an output signal indicative of the relative strength of the RF signals induced in the further pair of receive electrodes.

In an aspect of the invention for which protection is sought there is provided a proximity sensor comprising a substantially planar sensor substrate having a first sensor portion. The sensor comprises a second sensor portion and a third sensor portion disposed adjacent one another along a longitudinal axis of the substrate. The second sensor portion is provided between the first and third sensor portions. The substrate bears on a major face thereof a substantially planar transmit electrode. The first and third sensor portions each bear a substantially planar receive electrode on an opposite major face of the substrate to the transmit electrode. The second sensor portion comprises a first region. The sensor comprises a ground shield portion comprising one or more substantially planar, elongate electrodes. The ground shield portion has at least one elongate portion laterally disposed across at least a portion of a width of the substrate between the receive electrode of the first sensor portion and the first region of the second sensor portion, and at least one elongate portion laterally disposed across at least a portion of a width of the substrate between the first region of the second sensor portion and the receive electrode of the third sensor portion. The sensor is configured to allow a radio frequency (RF) signal to be applied to the transmit electrode to generate an electric field and to cause a corresponding RF signal to be induced in each receive electrode.

In another aspect of the invention for which protection is sought there is provided a proximity sensor comprising:
 a substantially planar sensor substrate, the substrate bearing on a major face thereof a substantially planar transmit electrode, the substrate further bearing on an opposite major face a first and a second substantially planar receive electrode, the first and second receive electrodes being provided at spaced apart locations with respect to one another, the substrate having a first region disposed between the first and second receive electrodes,
 the sensor further comprising a ground shield portion comprising one or more substantially planar, elongate electrodes, the ground shield portion having at least one elongate portion laterally disposed across at least a portion of a width of the substrate between the first receive electrode and the first region, and at least one elongate portion laterally disposed across at least a portion of a width of the substrate between the first region and the second receive electrode,
 the sensor being configured to allow the ground shield portion to be connected to earth and a radio frequency (RF) signal to be applied to the transmit electrode to generate an electric field and cause a corresponding RF signal to be induced in each receive electrode.

It is to be understood that the relative strength of the RF signals induced in the receive electrode of the respective portions will be responsive to the relative distance of a conducting object therefrom due to modification of the electric field by the conducting object.

In an aspect of the invention for which protection is sought there is provided a vehicle comprising a body, a plurality of wheels, a powertrain to drive said wheels, a braking system to brake said wheels, and a sensor according to another aspect.

In a further aspect of the invention for which protection is sought there is provided a method of detecting movement of an object by means of a proximity sensor. The method comprises providing a sensor according to another aspect. The method comprises applying a radio frequency (RF) signal to the transmit electrode to cause a corresponding RF signal to be induced in the receive electrodes. The controller is configured to provide an output signal indicative of the strength or relative strength of the RF signals induced in the receive electrodes.

In one aspect of the invention for which protection is sought there is provided a non-transitory computer readable carrier medium carrying computer readable code for controlling a vehicle to carry out the method of another aspect.

In another aspect of the invention for which protection is sought there is provided a computer program product executable on a processor so as to implement the method of another aspect.

In an aspect of the invention for which protection is sought there is provided a non-transitory computer readable medium loaded with the computer program product of another aspect.

In another aspect of the invention for which protection is sought there is provided a processor arranged to implement the method of another aspect, or the computer program product of another aspect.

It is to be understood that the controller or controllers described herein may comprise a control unit or computational device having one or more electronic processors. The system may comprise a single control unit or electronic controller or alternatively different functions of the controller may be embodied in, or hosted in, different control units or controllers. As used herein the term "control unit" will be understood to include both a single control unit or controller and a plurality of control units or controllers collectively operating to provide the stated control functionality. A set of instructions could be provided which, when executed, cause said computational device to implement the control techniques described herein. The set of instructions could be embedded in said one or more electronic processors. Alternatively, the set of instructions could be provided as software to be executed on said computational device. The controller may be implemented in software run on one or more processors. One or more other controllers may be implemented in software run on one or more processors, optionally the same one or more processors as the controller. Other arrangements are also useful.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which.

DETAILED DESCRIPTION

Figure 1:
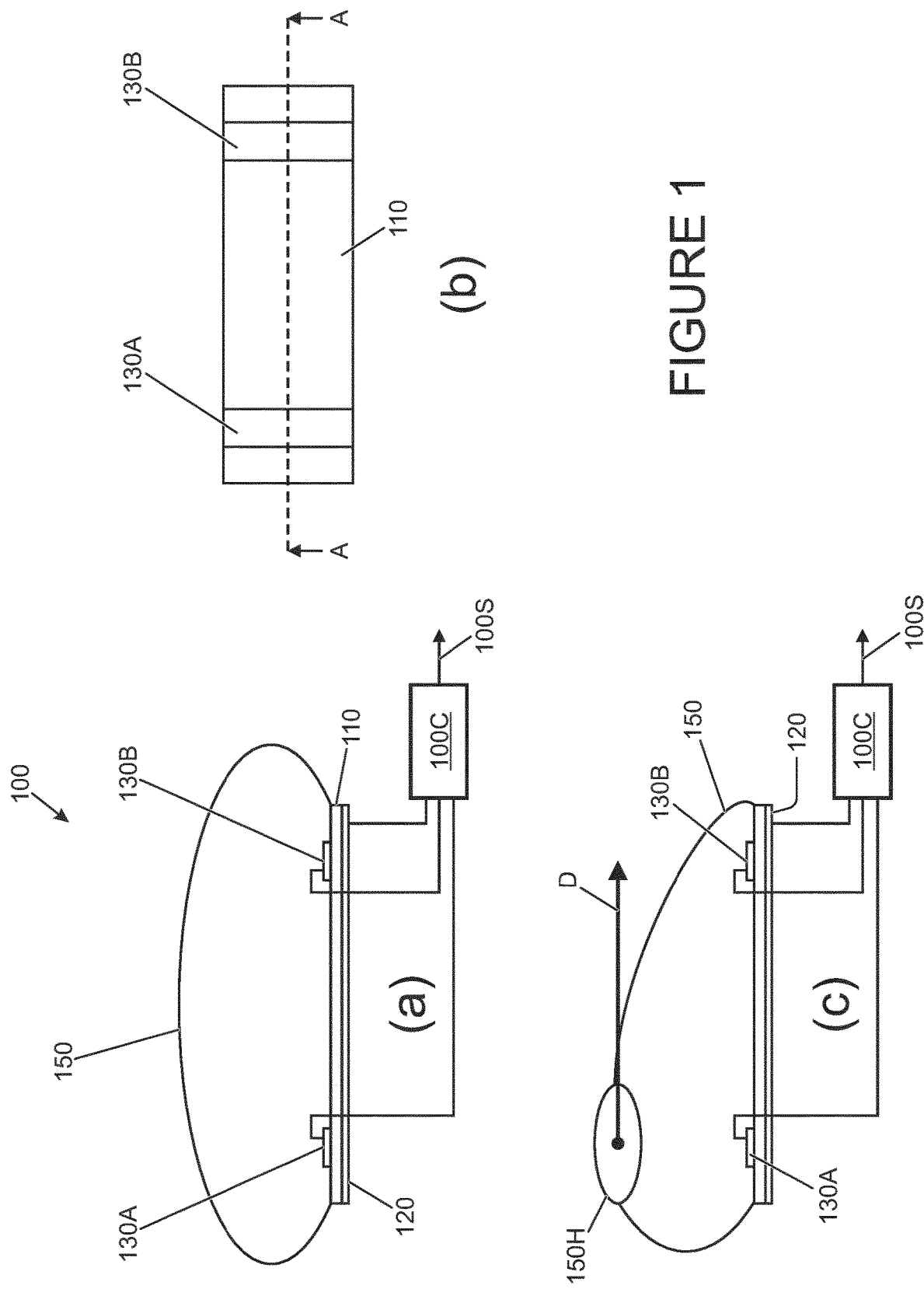
FIG. 1 is a schematic illustration of a known sensor for sensing movement of a human hand shown in (a) cross-sectional view along line A-A of the plan view shown in (b) and (c) distortion of an electric field created by the sensor in the presence of a human hand.

FIG. 1 is a schematic illustration of a known sensor for sensing movement of a human hand. The sensor 100 is shown in cross-section in FIG. 1(a) along line A-A of the plan view of FIG. 1(b), and in addition a control circuit 100C as described below. The sensor 100 has a substrate 110 having a transmit electrode 120 provided over a rear face thereof and a pair of receive electrodes 130A, 130B provided on a front face thereof. In the case of the sensor 100 of FIG. 1 the transmit electrode 120 covers substantially the whole of the rear face of the substrate 110 whilst the receive electrodes 130A, 130B are in the form of lateral stripe electrodes disposed across a width of the substrate 110.

The sensor 100 is arranged to be coupled to control circuit 100C that supplies a radio frequency (RF) signal to the transmit electrode 120, causing the transmit electrode 120 to generate an electric field that emanates from the sensor. The form of the field is indicated in outline at 150 in FIG. 1(a). The control circuit 100C is also electrically coupled to the first and second receive electrodes 130A, 130B respectively and is arranged to detect an electrical potential induced in each receive electrode 130A, 130B as a result of the potential applied to the transmit electrode 120.

The control circuit 100C monitors the potentials induced in the receive electrodes 130A, 130B and is configured to detect a variation in the magnitude of the potential (by reference to the amplitude of the signal) induced in the receive electrodes 130A, 130B that is consistent with movement of a user's hand in front of the sensor 100 from one side of the sensor 100 to the other. FIG. 1(a) illustrates schematically the shape of the electric field 150 when the sensor 100 is substantially isolated from any other objects above the sensor 100 with respect to the orientation shown. The magnitude of the electrical potential induced in the respective receive electrodes 130A, 130B is substantially the same in the situation illustrated in FIG. 1(a).

It is to be understood that, when a conducting object such as a hand 150H of a person penetrates the electric field 150 generated by the sensor 100, distortion of the field 150 typically occurs. As the hand 150H moves, the shape of the electric field 150 changes, and in turn the relative strength of the signals induced in the receive electrodes 130A, 130B changes. An example of distortion of the field 150 in the presence of a hand 150H is illustrated in FIG. 1(c). In the particular situation illustrated in FIG. 1(c) the hand 150H is positioned substantially directly above the first receive electrode 130A, causing the electric field 150 to be distorted in a direction towards the hand 150H. The strength of the portion of the electric field 150 to which the first receive electrode 130A is exposed is increased and the strength of the portion of the electric field 150 to which the second receive electrode 130B is exposed is decreased in the situation illustrated relative to the situation illustrated in FIG. 1(a) in which neither the hand nor any other object is present in the vicinity of the sensor 100.

If the hand 150H is moved laterally over the sensor 100 with respect to the orientation shown in FIG. 1(c), in the direction of arrow D, the relative strengths of the portions of the electric field 150 to which the respective receive electrodes 130A, 130B are exposed changes, shifting in favour of the second receive electrode 130B. The control circuit 100C detects the change in relative amplitudes of the signals induced in the respective receive electrodes 130A, 130B and if the changes are consistent with movement of an object in the direction of arrow D or the opposite direction, over at least a predetermined distance, the circuit 100C outputs a signal 100S indicative whether the hand 150H moved relative to the sensor 100 in the direction of arrow D or in the opposite direction.

Figure 2:
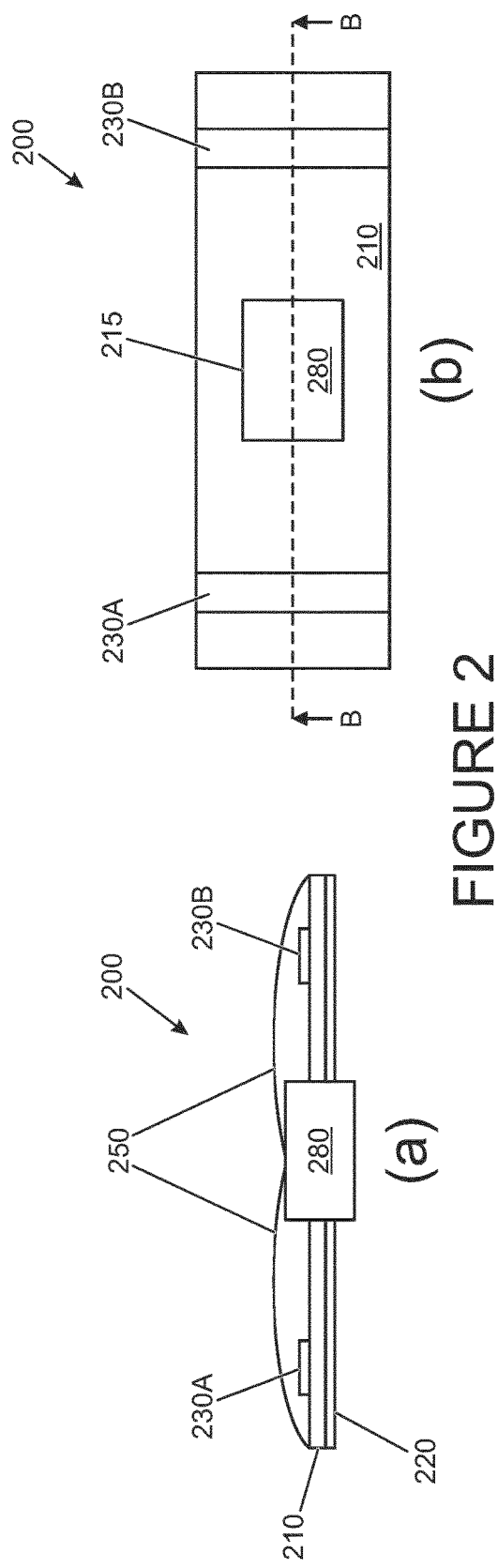
FIG. 2 is a schematic illustration of a sensor devised by the present applicant and not according to an embodiment of the present invention in (a) cross-sectional view along line B-B shown in (b)

FIG. 2 illustrates a further example of a known sensor 200. Like features of the sensor 200 of FIG. 2 to those of the sensor 200 of FIG. 1 are shown with like reference signs incremented by 100.

The sensor 200 is similar to that of the arrangement of FIG. 1 except that an aperture 215 has been formed in the substrate 210, between the receive electrodes 230A, 230B. A portion 280 of a wireless optical datalink module has been introduced into the aperture 215 in order to take advantage of unoccupied space above and below the substrate 210. The wireless datalink is arranged to permit streaming of data between one or more mobile devices carried by a user and a vehicle infotainment system. Other modules may be introduced into the aperture in addition or instead, in some embodiments. It is to be understood that the sensor 200 offers a potentially useful location for a module such as a datalink module that requires to be provided in relatively close proximity to a user, and in some cases to directly face a user. The sensor 200 must be located sufficiently close to the user to allow the user's hand conveniently to modify the shape of the electric field 150 and permit detection of movement of the user's hand in the manner described above. Conveniently, in some embodiments the sensor 200 may be located directly above a user, for example by being integrated into a switchpack or instrument cluster provided in a roof or ceiling area of a vehicle.

The present applicant has identified that the performance of the sensor 200 of FIG. 2 is degraded relative to that of the sensor 100 of FIG. 1. It is believed that the inferior performance of the sensor element 200 is due to disturbance of the electric field 250 in the presence of the module 280, which contains electrically conducting materials in the form of conducting wiring and components associated with the module 280. As shown schematically in FIG. 2(a), the distance the electric field 250 generated by the transmit electrode 220 projects from the sensor element 200 is significantly reduced in the arrangement of FIG. 2 compared with the arrangement of FIG. 1.

It is to be understood that packaging of components in certain technical applications such as in automotive, aerospace and maritime environments is a significant problem. As technologies advance it is desirable to introduce greater and greater functionality into such environments and there is increasing competition between technologies for the relatively small amounts of space available to accommodate them. The present applicant has identified the sensor 100 as having the potential to accommodate additional functionality but the severely degraded sensor performance exhibited by the sensor 200 of FIG. 2 is unacceptable.

The present application has found that acceptable performance of the sensor 200 of FIG. 2 can be obtained if a conducting track is provided around the aperture formed in the substrate 210 and maintained at substantially earth potential.

FIG. 3(a) shows a sensor 300 according to an embodiment of the present invention in cross-sectional view along line C-C of the plan view shown in FIG. 3(b). As shown in FIG. 3(b) the substrate 310 has an aperture 315 and a relatively thin and substantially continuous conducting ground shield element 340 disposed on the substrate 310 around the aperture 315, forming a substantially continuous loop. The ground shield element 340 is arranged to be connected to ground.

Figure 3:
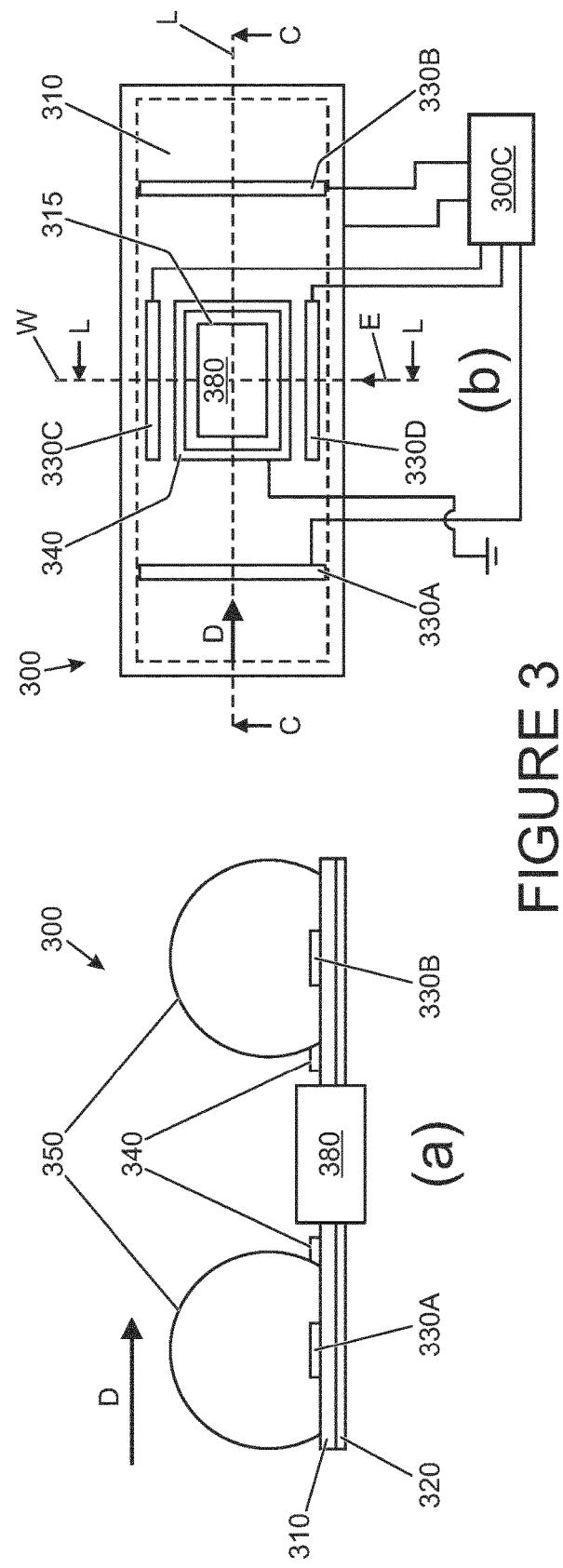
FIG. 3 is a schematic illustration of a sensor according to an embodiment of the present invention in (a) cross-sectional view along line C-C shown in (b)

In the embodiment of FIG. 3 four receive electrodes 330A-D are provided on the substrate 310, again on the opposite side of the substrate 310 to the transmit electrode 220. First and second receive electrodes 330A, 330B are in the form of lateral stripe electrodes disposed across a width of the substrate 310 in a similar manner to the arrangements of the sensors 100, 200 of FIG. 1 and FIG. 2. In the embodiment of FIG. 3 the first and second receive electrodes 330A, 330B are provided on first and second opposite sides of the aperture 315 to one another.

Third and fourth receive electrodes 330C, 330D are also in the form of stripe electrodes and provided on third and fourth opposite sides of the aperture 315 that are substantially orthogonal to the first and second opposite sides. Longitudinal axes of the third and fourth receive electrodes 330C, 330D are oriented mutually parallel to one another but are orthogonal to those of the first and second electrodes 330A, 330B, parallel to sides of the aperture 315 that are orthogonal to the first and second electrodes 330A, 330B.

The transmit electrode 320 and each of the receive electrodes 330A-D are coupled to controller 300C. The controller 300C is configured to apply an RF signal to the transmit electrode 320, in the present embodiment at a frequency of 1 GHz, and to detect signals induced in each of the receive electrodes 330A-D. The controller 300C monitors the relative strengths of the signals received from the receive electrodes 330A-D and correlates the signals in order to detect movement of a conducting object within the RF field generated by the transmit electrode 320 in response to the applied RF signal.

It is to be understood that movement of a conducting object in the direction of arrow D parallel to and directly above a longitudinal axis L of the sensor 300 (coincident with line C-C of FIG. 3(c)) and equidistant from the third and fourth receive electrodes 330C, 330D will result in a substantially continuous change in the relative strength of the RF signals induced in the first and second receive electrodes 330A, 330B whilst movement in a direction normal to arrow E, such as along the direction of arrow E, will result in a substantially continuous change in the relative strength of the RF signals induced in the third and fourth electrodes 330C, 330D. The controller 300C is configured to process the relative signal strengths and to distinguish between movement in the direction of arrow D from movement in the direction of arrow E. In the present embodiment, when movement in the direction of arrow D is detected the controller 300C outputs a first signal, whilst movement in the opposite direction results in the output of a second signal. The vehicle may be configured such that the first signal triggers opening of a sunroof whilst the second signal triggers closing of the sunroof. If the controller 300C detects movement in the direction of arrow E, a third signal is generated whilst movement in the reverse direction triggers the generation of a fourth signal. These signals may be employed to trigger tilting and un-tilting of the sunroof in the present embodiment. It is to be understood that, in other embodiments, other functionality may be triggered in addition or instead.

The present applicant has found that, by providing the conducting ground shield element 340 around the aperture 315, the surprising technical effect is observed that the amount by which the electric field 350 generated by the transmit electrode 320 in front of the substrate is attenuated in the presence of an object within the aperture 315 that comprises conducting material is substantially reduced, relative to the arrangement of FIG. 2. In the embodiment in FIG. 3, an optical communications module in the form of a wireless optical datalink module 380 is shown inserted within the aperture 315 provided in the substrate 310 of the sensor 300.

FIG. 3 illustrates the applicant's understanding of the form of the electric field 350 in a highly schematic manner. It is to be understood that the actual form of the electric field 350 may differ from that illustrated in FIG. 3(a) which is highly schematic and based on empirical observation rather than detailed field measurements. Similarly the form of the fields shown in FIG. 1(a), FIG. 1(c) and FIG. 2(a) are also highly schematic and based on empirical observations. Nevertheless, the applicant has found that the surprising technical effect of the presence of the conducting ground shield element 340 in decreasing the amount by which performance of the sensor 300 is degraded by the presence of a conducting object within the aperture 315 is invaluable in enabling high component packaging densities to be enjoyed in motor vehicle technology applications.

Figure 4:
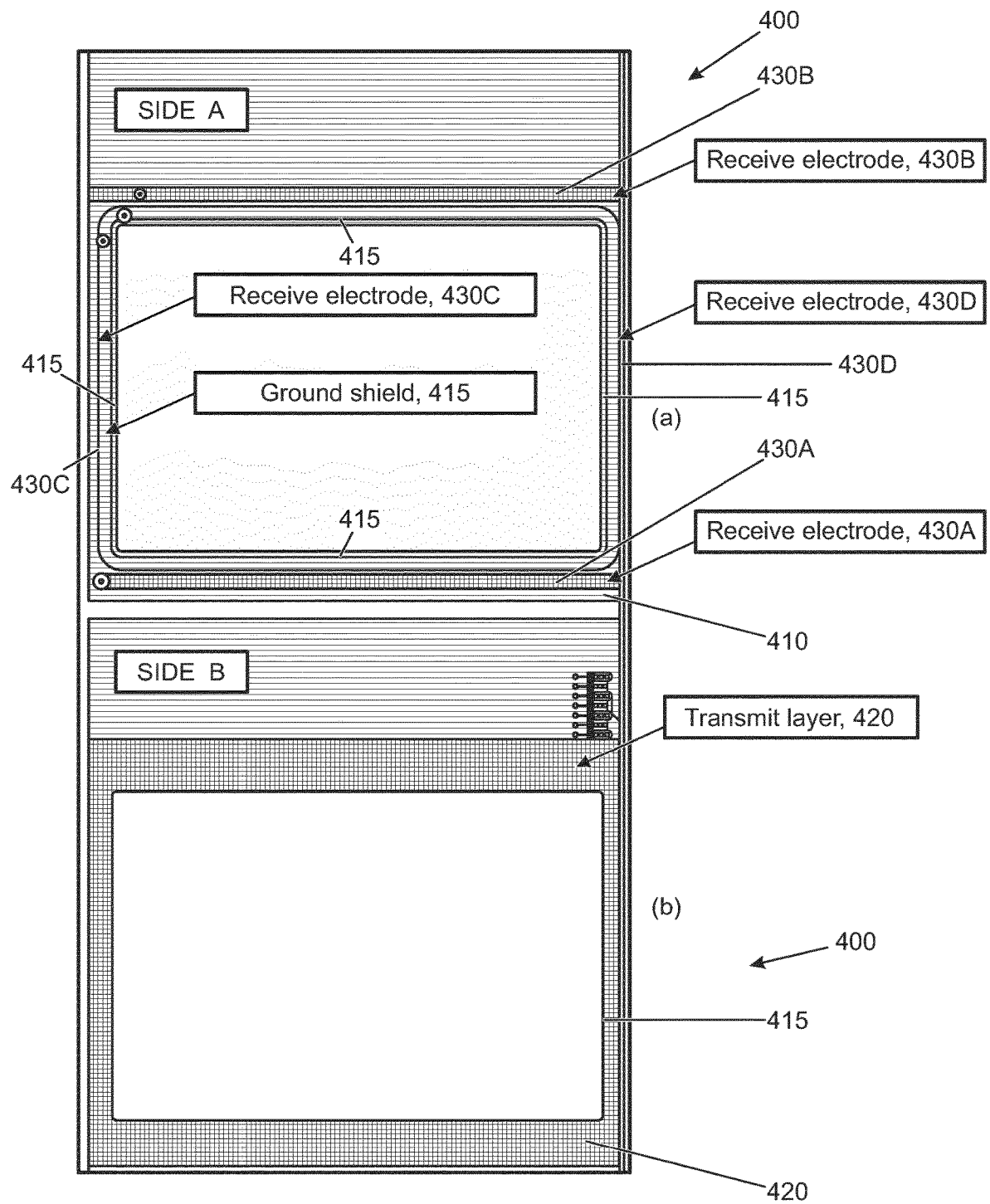
FIG. 4 is a plan view of a sensor according to an embodiment of the present invention.

FIG. 4 shows a sensor 400 according to a further embodiment of the present invention. FIG. 4(a) is a view of a top side of the sensor 400 whilst FIG. 4(b) is a view of a bottom side of the sensor 400. Like features of the embodiment of FIG. 4 to those of the embodiment of FIG. 3 are shown with like reference signs incremented by 100.

The sensor 400 is formed from a substrate 410 that has a layer of copper provided on each major face. In the embodiments of FIG. 3 and FIG. 4 the substrate 310, 410 is formed from woven glass and epoxy resin and has a thickness of approximately 2 mm. Other materials and other thicknesses of substrate may be useful in some embodiments such as polytetrafluoroethylene (PTFE or Teflon). The substrate has an aperture 415 formed therein of a size allowing a portion of a wireless data link module (not shown in FIG. 4) to be disposed therethrough. A first pair of receive electrodes 430A, 430B are disposed on the top side of the substrate 410 on respective opposite sides of the aperture 415 whilst a second pair of receive electrodes 430C, 430D are also disposed on the top side of the substrate 410, again on respective opposite sides of the aperture 415, being sides that are orthogonal to those on which the first pair 430A, 430B are disposed. Each of the receive electrodes 430A-D are elongate in form, being in the form of rectangular stripe elements. The first pair of electrodes 430A, 430B have mutually parallel longitudinal axes that are orthogonal to those of the second pair 430C, 430D. A conducting ground shield element 440 is disposed on the substrate 410 around the aperture 415, forming a substantially continuous loop around the aperture 415.

The bottom side of the substrate has a substantially continuous layer of copper material that provides the transmit electrode 420. In the embodiment of FIG. 4 the transmit electrode 420 is perforated, although in some other embodiments the transmit electrode 420 is unperforated. The sensor 400 is configured to be coupled to a controller 300C in a similar manner to the embodiment of FIG. 3.

Figure 5:
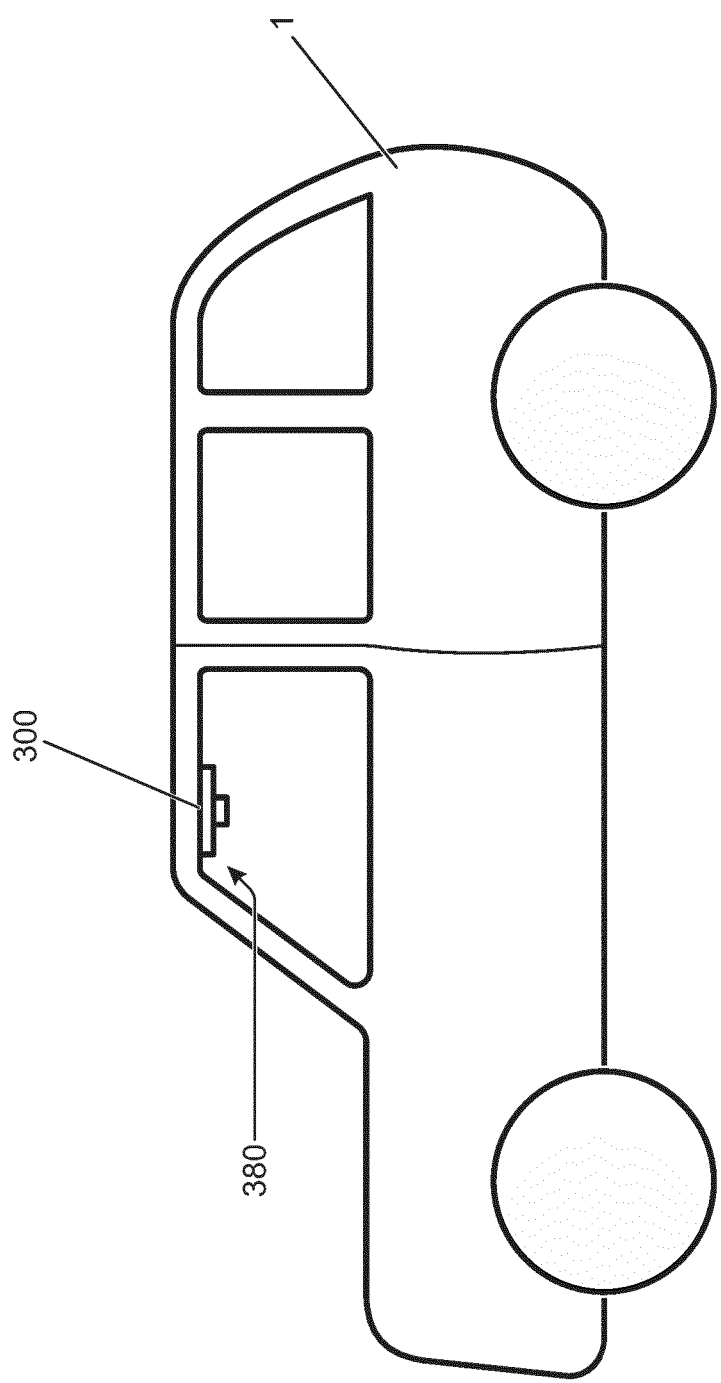
FIG. 5 is a schematic illustration of a motor vehicle including a sensor according to an embodiment of the present invention.

FIG. 5 shows a vehicle 1 in which a sensor 300 of the embodiment of FIG. 2 has been installed at a ceiling of the vehicle 1 in a location accessible to a driver's hand. A Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

The invention claimed is:

1. A proximity sensor, comprising:
   a substrate;
   a transmit electrode disposed on a first major face of the substrate;
   first and second receive electrodes disposed in spaced apart relationship on an opposite major face of the substrate;
   wherein the sensor is configured to allow a radio frequency (RF) signal to be applied to the transmit electrode to cause a corresponding RF signal to be induced in each of the first and second receive electrodes, wherein a relative strength of RF signals induced in the first and second receive electrodes is dependent on a relative distance of a conducting object therefrom; and
   a ground shield portion disposed on the opposite major face of the substrate in a space between the first and second receive electrodes, the ground shield portion comprising at least elongate first and second electrode portions disposed in spaced apart relationship and defining, at least in part, a first region therebetween, wherein the first region comprises an aperture therethrough, the aperture being formed in the substrate and extending between the first major face and the opposite major face thereof.

2. The sensor according to claim 1, wherein the ground shield portion is arranged to encompass the first region.

3. The sensor according to claim 1, wherein the first and second receive electrodes and the first region each comprise a respective portion of a common substrate.

4. The sensor according to claim 1, wherein the conducting object is disposed through the aperture of the first region.

5. The sensor according to claim 1, wherein at least one electronic device is disposed through the aperture of the first region.

6. The sensor according to claim 1, wherein at least a portion of a wireless optical communications transmitter and/or receiver is disposed through the aperture of the first region.

7. The sensor according to claim 1, further comprising a sensor controller, the sensor controller configured to apply the radio frequency (RF) signal to the transmit electrode to cause a corresponding RF signal to be induced in each of the first and second receive electrodes, and the controller configured to provide an output signal indicative of the relative strength of the RF signals induced in the first and second receive electrodes.

8. The sensor according to claim 7, wherein a first axis of the sensor passes through the first and second receive electrodes and a second axis of the sensor, orthogonal to the first axis, passes through each of a further pair of receive electrodes arranged on opposite sides of the first region, wherein a relative strength of the RF signals induced in the further pair of receive electrodes is responsive to a relative distance of the conducting object therefrom, and wherein the controller is configured to provide an output signal indicative of the relative strength of the RF signals induced in the further pair of receive electrodes.

9. A vehicle comprising a body, a plurality of wheels, a powertrain to drive the wheels, a braking system to brake the wheels, and the proximity sensor according to claim 1.

10. A method of detecting movement of an object by a proximity sensor, the method comprising:
providing the proximity sensor of claim 1;
applying a radio frequency (RF) signal to the transmit electrode to cause a corresponding RF signal to be induced in the first and second receive electrodes; and
providing an output signal indicative of the strength or relative strength of RF signals induced in the first and second receive electrodes.

11. A non-transitory computer readable carrier medium comprising computer readable code for controlling a vehicle to carry out the method of claim 10.

12. A processor arranged to implement the method of claim 10.

13. The sensor according to claim 1, wherein the ground shield position is arranged to form a substantially continuous loop around the aperture.

14. The sensor according to claim 1, wherein the transmit electrode is a layer of perforated material.

15. Tue sensor according to claim 1, wherein the first and second receive electrodes are rectangular stripe elements.

16. A proximity sensor, comprising:
a substrate;
a transmit electrode disposed on a first major face of the substrate;
first and second receive electrodes disposed in spaced apart relationship on an opposite major face of the substrate;
wherein the sensor is configured to allow a radio frequency (RF) signal to be applied to the transmit electrode to cause a corresponding RF signal to be induced in each of the first and second receive electrodes, wherein a relative strength of RF signals induced in the first and second receive electrodes is dependent on a relative distance of a conducting object therefrom; and
a ground shield portion disposed on the opposite major face of the substrate between the first and second receive electrodes, the ground shield portion comprising at least first and second elongate electrode portions disposed in spaced apart relationship and defining, at least in part, a first region therebetween, wherein the first region comprises an aperture therethrough, the aperture being formed in the substrate and extending between the first major face and the opposite major face thereof, wherein a first axis of the sensor passes through the first and second receive electrodes and a second axis of the sensor, orthogonal to the first axis, passes through each of a further pair of receive electrodes arranged on opposite sides of the first region, wherein a relative strength of RF signals induced in the further pair of receive electrodes is responsive to a relative distance of the conducting object therefrom.

17. A proximity sensor, comprising:
a substantially planar sensor substrate, the substrate bearing on a major face thereof a substantially planar transmit electrode, the substrate further bearing on an opposite major face a first and a second substantially planar receive electrode, the first and second receive electrodes being provided at spaced apart locations with respect to one another, the substrate having a first region disposed between the first and second receive electrodes, wherein the first region comprises an aperture therethrough, the aperture being formed in the substrate and extending between the first major face and the opposite major face thereof; and
a ground shield portion comprising one or more substantially planar, elongate electrodes, the ground shield portion having at least one elongate portion laterally disposed across at least a portion of a width of the substrate between the first receive electrode and the first region, and at least one elongate portion laterally disposed across at least a portion of a width of the substrate between the first region and the second receive electrode;
wherein the sensor is configured to allow the ground shield portion to be connected to earth and a radio frequency (RF) signal to be applied to the transmit electrode to generate an electric field and cause a corresponding RF signal to be induced in each of the first and second receive electrodes.

\* \* \* \* \*